United States Patent [19]

Rockenfeller et al.

[11] Patent Number: 5,396,775

[45] Date of Patent: * Mar. 14, 1995

[54] COOLING APPARATUS FOR ELECTRONIC AND COMPUTER COMPONENTS

[75] Inventors: Uwe Rockenfeller; Lance D. Kirol, both of Boulder City, Nev.

[73] Assignee: Rocky Research, Boulder City, Nev.

[*] Notice: The portion of the term of this patent subsequent to Feb. 16, 2010 has been disclaimed.

[21] Appl. No.: 149,453

[22] Filed: Nov. 9, 1993

Related U.S. Application Data

[60] Division of Ser. No. 794,501, Nov. 19, 1991, Pat. No. 5,271,239, which is a continuation-in-part of Ser. No. 612,412, Nov. 13, 1990, Pat. No. 5,161,389, and Ser. No. 732,652, Jul. 19, 1991, Pat. No. 5,186,020, which is a continuation-in-part of Ser. No. 644,833, Jan. 23, 1991, abandoned.

[51] Int. Cl.⁶ ............................................. F25B 15/00
[52] U.S. Cl. ........................................ 62/112; 62/480; 62/259.2
[58] Field of Search ............. 62/477, 480, 259.2, 62/112; 165/80.2, 104.12; 361/695, 700

[56] References Cited

U.S. PATENT DOCUMENTS

| | | | |
|---|---|---|---|
| 1,833,901 | 12/1931 | Hull | 62/477 |
| 1,932,492 | 9/1930 | Smith | 62/118 |
| 1,992,745 | 2/1935 | Elfving | 62/480 |
| 2,088,276 | 12/1932 | Nesselmann et al. | 62/118 |
| 2,167,264 | 6/1951 | Dunz | 62/480 |
| 2,496,459 | 2/1950 | Kleen | 62/480 |
| 2,557,373 | 6/1951 | Coons | 62/480 |
| 4,051,509 | 9/1977 | Beriger et al. | 62/480 |
| 4,199,959 | 4/1980 | Wurm | 62/480 |
| 4,205,531 | 6/1980 | Brunberg et al. | 62/101 |
| 4,468,717 | 8/1984 | Mathias et al. | 62/480 |
| 4,523,635 | 6/1985 | Nishizaki et al. | 165/104.12 |
| 4,548,046 | 10/1985 | Brandon et al. | 62/79 |
| 4,623,018 | 11/1986 | Takeshita et al. | 165/104.12 |
| 4,694,659 | 9/1987 | Shelton | 62/106 |
| 4,765,395 | 8/1988 | Paeye et al. | 165/104.12 |
| 4,822,391 | 4/1989 | Rockenfeller | 62/12 |
| 4,848,944 | 7/1989 | Rockenfeller | 62/4 |
| 4,881,376 | 11/1989 | Yonezawa et al. | 62/106 |
| 4,944,159 | 1/1990 | Crozat | 62/112 |
| 4,976,117 | 12/1990 | Crozat et al. | 62/480 |
| 5,024,064 | 6/1991 | Yonezawa et al. | 62/106 |
| 5,057,132 | 10/1991 | Lebrun et al. | 62/4 |
| 5,186,020 | 2/1993 | Rockenfeller et al. | 62/457.9 |

FOREIGN PATENT DOCUMENTS 0196863 8/1986 European Pat. Off. .
0193747 10/1986 European Pat. Off. .

Primary Examiner—Henry A. Bennett
Assistant Examiner—William C. Doerrler
Attorney, Agent, or Firm—Jerry R. Seiler

[57] ABSTRACT

Apparatus for cooling components or subassemblies of equipment at one or more locations comprises a first reactor located at a remote location from said equipment, and a second reactor located in heat exchange communication with a component or subassembly of said equipment, each of said first or second reactors containing a different complex compound of a polar refrigerant and a metal salt, wherein the equilibrium temperature of the complex compound in said first reactor differs from the equilibrium temperature of the complex compound in said second reactor by between about 10° C. and about 150° C. at the same operating pressure, heating means for heating a complex compound in said first reactor, and conduit means for directing polar refrigerant between said reactors.

16 Claims, 2 Drawing Sheets

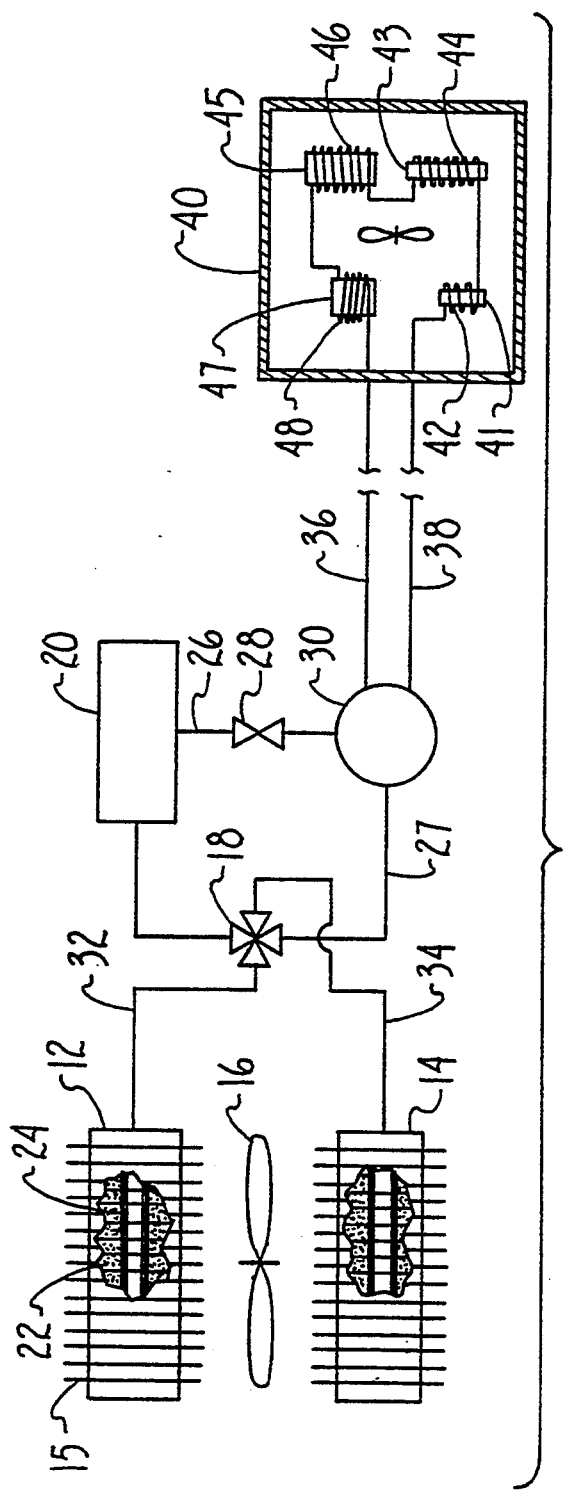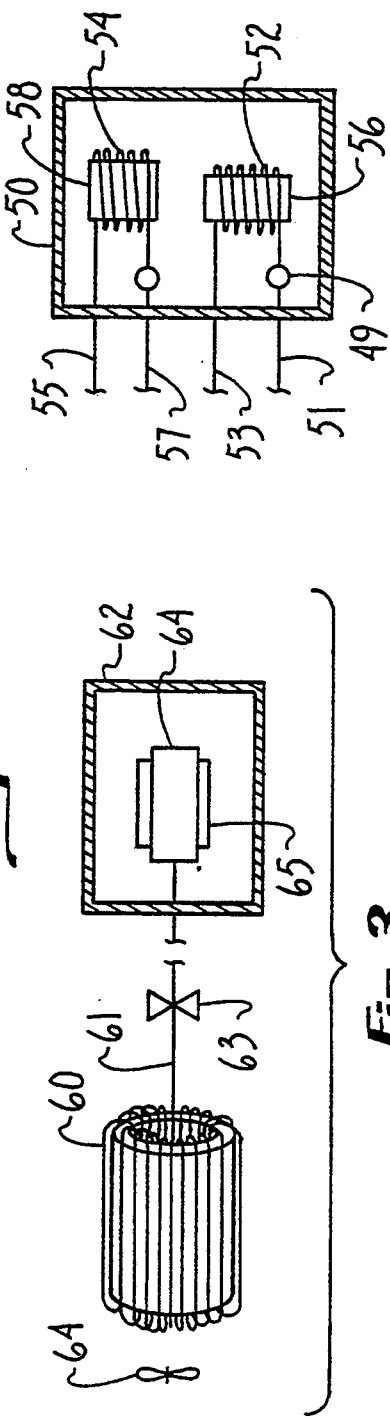

COOLING APPARATUS FOR ELECTRONIC AND COMPUTER COMPONENTS

This application is a divisional of application Ser. No. 07/794,501, filed Nov. 19, 1991, now U.S. Pat. No. 5,271,239, which is a continuation-in-part of applications Ser. Nos. 612,412, filed Nov. 13, 1990, now U.S. Pat. Nos. 5,161,389, and 732,652, filed Jul. 19, 1991, now U.S. Pat. No. 5,186,020 which is a continuation-in-part of application Ser. No. 644,833, filed Jan. 23, 1991, now abandoned.

BACKGROUND OF THE INVENTION

The present invention provides an apparatus having a capability for cooling even relatively small electronic or computer components. Presently used cooling apparatus for such equipment usually requires the cooling of entire rooms, spaces or cubicles in which the equipment is to be used and maintained during operation. Obviously, such cooling requires relatively large capacity refrigeration equipment wasting substantial amounts of electrical energy required to supply power to such equipment. The problem with such systems is the inability to direct and concentrate cooling at the specific components to be maintained at the reduced operating temperatures without cooling the surrounding area in which the equipment is housed. Thermoelectric spot cooling devices have limited cooling temperature capabilities and capacities and are relatively inefficient and typically incorporate heavy and/or bulky components for heat transfer. In addition, reject heat is difficult to remove from the area adjacent the cooling load spot.

SUMMARY OF THE INVENTION

The present invention incorporates apparatus capable of cooling even relatively small components of computers or other electronic equipment, almost instantaneously, without wasting substantial power by cooling unnecessary components, equipment or even the area in which the equipment is operated. The apparatus and method of the present invention provide the capacity of achieving spot cooling by using capillary or small sized tubing to form or create an evaporator cooler in heat exchange contact with the specific component or components to be cooled. The apparatus is thus capable of providing cooling directly at the component to be cooled, whereby it may be maintained at any desired or given temperature with heat rejection performed remote from the cooling area. In another embodiment of the invention a cooling loop is used to cool individual components with a circulating liquid, gas or phase change process and precooling of the heat transfer medium performed at one or more locations interfaced with the complex compound system evaporator or desorber. The invention utilizes the benefit of complex compound technology in which a refrigerant ligand is alternately adsorbed and desorbed to and from a solid salt-based complex compound. The apparatus and system provides further advantage in avoiding the necessity of using compressors, pumps, burners, etc. thus simplifying the cooling equipment as well as substantially reducing parasitic power demands. These as well as other advantages will be evident from the following detailed description.

BRIEF DESCRIPTION OF THE DRAWING

FIGS. 1–3 are schematic illustrations of different embodiments of the apparatus of the invention, FIG. 1 showing a cooling system wherein the evaporators for cooling electronic components are connected in series;

FIG. 2 illustrates an embodiment utilizing the apparatus of FIG. 1 in which the cooling evaporators are used in parallel;

FIG. 3 schematically shows a cooling system apparatus of the invention incorporating separate reactors;

DETAILED DESCRIPTION OF THE INVENTION

Figure 5:
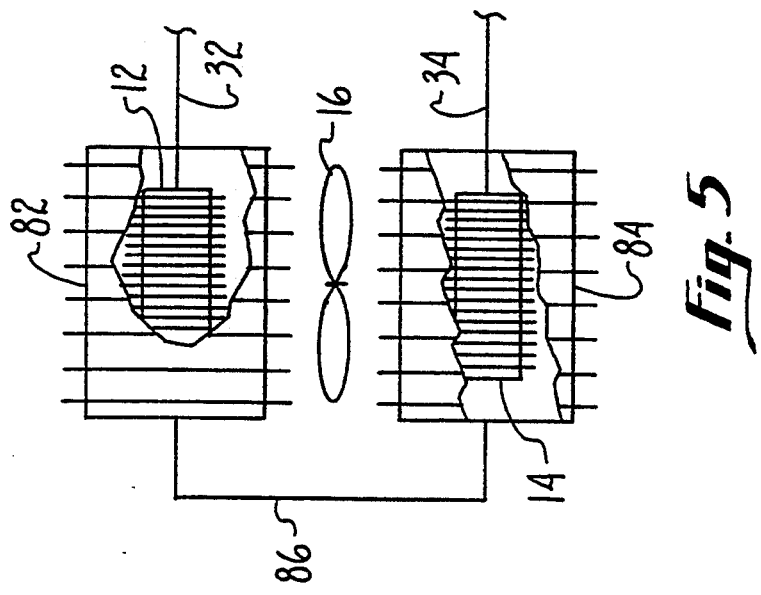
FIG. 5 illustrates the use of heat exchange jackets used for reactors of a system of FIG. 1.

The cooling apparatus and system of the invention shown in FIG. 1 comprises a pair of reactors 12 and 14, each containing a complex compound of a metal salt and a polar refrigerant. The reactors, illustrated schematically, are shown partially cut-away to expose the interior in which the complex compound 22 is provided. Each reactor also contains a means for heating the complex compound to cause desorption of the refrigerant from the salt, preferably in the form of an electrical resistance heating element 24, electrically connected to a power source. The reactors are also provided with fins 15 to promote heat exchange when the reactors are to be cooled. A fan 16 may be provided for such cooling, for example, by forcing ambient temperature air across one or more reactor surfaces during such cooling. Since the reactors are alternately heated for alternate desorption of the refrigerant, the fan may be reversible, and the reactors may be in separate compartments provided with air-flow directing devices or valves for such alternate cooling. Suitable equipment designs of the reactor apparatus are disclosed in the aforesaid co-pending applications, and the description thereof is incorporated herein by reference. The design of the reactors for obtaining improved performance for complex compound refrigerant adsorption and desorption are disclosed in co-pending application Ser. No. 320,562, filed Mar. 8, 1989, and the aforesaid co-pending applications the descriptions of which are also incorporated herein by reference. The electrical components for providing power to the electrical heating elements of the reactors and for driving the fan and other necessary components for operating the reactors is not shown and is not described herein, but will be understood by those skilled in the art. In addition, other heating means for heating the complex compounds in the reactors may be used, for example, gas heaters or hot air or heat exchange tubes.

The complex compounds suitable for use in the reactors are described in the aforesaid co-pending and incorporated patent applications as well as in U.S. Pat. No. 4,848,944, the description of which is also incorporated herein by reference. Specifically, the preferred compounds used in the present apparatus comprise metal halides, particularly chlorides, fluorides, borofluorides, bromides and iodides, nitrates, nitrites, sulfides, oxalates, sulphates or chlorates of a metal salt selected from the group consisting of an alkali and alkaline earth metal, transition metal, aluminum, zinc, copper, cadmium and tin. Preferred salts are calcium bromide, calcium chloride, strontium bromide, strontium chloride, cobalt chloride, nickel chloride, ferrous and ferric chloride and sodium boroflouride, complexed with ammonia to form complexes disclosed in the aforesaid applications and patent. NaBF$_4$, double metal chloride salts and combinations of salts and compounds as well as eutectic, peritectic and stoichiometric mixtures thereof may also be included, with specific salts being chosen primarily for efficiency in cycling adsorption and desorption reactions. Calcium bromide complexed with 2–6 moles ammonia per mole of salt is especially preferred to achieve a cooling at power densities exceeding one kW/kg of complex compound material for cycle periods of up to fifteen minutes at temperatures below −20° F. Calcium and strontium chloride/ammonia complexes form high power densities above −20° F. The complex compound in a reactor may also be of a single metal salt or a mixture of salts. For example, where rate of adsorption or desorption is important for quick cool down, load control, etc. a mixture of salts may be used to take advantage of complex compounds having such properties.

The salts are complexed with a polar refrigerant to form the complex compounds. Polar refrigerants as used herein is intended to define polar gaseous refrigerants capable of forming coordinative complex compounds with the aforesaid salts. Examples of polar refrigerants suitable for forming such complexes comprise ammonia, water, lower alkanols, especially methanol, alkanolamines, alkylamines especially methylamine, polyamines, sulphur dioxide, and phosphine. It is to be understood that by reference herein to the preferred refrigerant ammonia, the other suitable refrigerants are also intended, specifically including HCFCs and HFCs carrying a dipole moment.

A condenser 20 is provided for cooling and condensing the ammonia from each of the reactors. Such a condenser is preferably provided with suitable heat exchange fins, coiled conduits, or other equivalent means for cooling the ammonia during condensation. The condensation preferably occurs at ambient or room temperature, and a fan, not shown, may be used to force air over the condenser heat exchange fins or components for improving ambient temperature condensation.

An accumulator 30 may also be used for separating liquid and gaseous phases of the ammonia refrigerant as it passes to and from the evaporator cooling the electronic or computer equipment component. Such an accumulator may be especially useful for preventing liquid refrigerant from returning to the reactors where evaporation may be incomplete, for example, due to reduced or diminished cooling requirements of the electronic or computer apparatus during any period of operation. It may be advantageous or necessary to provide a refrigerant pump for directing refrigerant from the accumulator to the evaporator(s).

Suitable conduits 32 and 34 direct gaseous refrigerant to and from the respective reactors and cooperate with a valve 18 for directing the gas from the reactors to condenser 20 and to accumulator 30 via conduit 26. A valve 28 may also be used in conduit 26 if desired. Pipe 27 directs gas from the accumulator to the reactors, or directly from the evaporators via valve 18, where an accumulator is not used. Other suitable conduits, valves, and combinations thereof may also be used for modifying the design of the apparatus to achieve the desired function and that shown is by way of illustration only. Spot cooling is obtained by using capillary or small sized tubing to and from the evaporators. Normally, sizes up to about ⅜" diameter will be suitable, and if desired, smaller tubing, especially capillary tubing may be preferred. Evaporator surfaces may be extended and bonded to the components to be cooled using materials capable of withstanding repeated thermal expansion and contraction.

The aforesaid reactors, condenser and accumulator components will be located in one or more suitable apparatus compartments or housing members away or remote from the equipment to be cooled by the evaporators so that heat rejection of the reactors and condenser will not affect the cooling efficiency of the system. The apparatus may also include suitable controller and/or processor means and devices for automatically and sequentially operating the reactor heaters and fans in a manner similar to that described in the aforesaid and incorporated application Ser. No. 612,412, and as will be understood by those skilled in the art.

The evaporator side of the system or apparatus of the invention is also illustrated, that shown in FIG. 1 comprising a plurality of evaporators connected in series along a single refrigerant conduit. FIG. 2 is an illustration of a pair of parallel evaporators each having separate conduits for directing the refrigerant gas. In the series evaporator embodiment shown in FIG. 1, refrigerant gas from accumulator 30 is directed by conduit 38 successively through evaporators 42, 44, 46 and 48, each of which is in heat exchange communication with a different electronic or computer equipment component 41, 43, 45 and 47, respectively. An electronic apparatus 40 is shown by way of illustration containing the components to be cooled. Of course, it will be understood, that one or any number of components may be simultaneously cooled, and the system and apparatus of the invention may be modified by adding the necessary evaporators and reactor capacity to meet the requirements.

In FIG. 2, evaporators 52 and 54 are shown for providing spot cooling for components 56 and 58, respectively in electronic or computer equipment 50. In this illustration, each of the evaporators has its own gas inlet and outlet pipe, so that the evaporators are operated in parallel. The gas inlet line 51 and 57 may incorporate an expansion valve 49 where an accumulator is not present in the system. In such an embodiment, with or without an expansion valve, any number of parallel evaporators may be used to accommodate the desired number of components to be cooled. The parallel evaporator embodiment may be especially useful where there is substantially greater cooling requirement for each of the components, or where the components are grouped such that a single evaporator may be used to cool multiple and closely spaced components. The gas inlet conduits 51 and 57 and gas outlet conduits 53 and 55 will also cooperate with suitable valves for directing the refrigerant from the condenser to the evaporators, and back to the reactor. For example, one-way valves may be used in such conduits. It will also be evident and understood that the apparatus of the invention may incorporate a combination of parallel and serial evaporators where desired or advantageous. One or more fans may also be used in cooperation with the evaporators in a sealed electronic component or system housing to assist in distributing evaporation cooling, where desired.

In the embodiment illustrated in FIG. 3, the cooling apparatus incorporates two reactors, each charged with a different ammonia-salt complex. The ammonia flows, in gaseous phase, between the two reactors as the different salts alternately adsorb and desorb ammonia in exothermic and endothermic reactions, respectively. In this embodiment, unlike the previously described reactor system illustrated in FIGS. 1 and 2, ammonia does not go through a liquid/gas phase change. The evaporator or evaporators and the condenser are replaced with a second reactor that provides the cooling at the site of the electronic or computer component to be cooled as the complex compound in the reactor desorbs ammonia. In such an apparatus illustrated schematically in FIG. 3, first reactor 60 is the high temperature or hot reactor, operating between ambient and driving temperature and the second reactor 64 is the cooling or low temperature reactor operating between cooling and ambient temperature. The high temperature reactor 60 may be substantially identical in features and construction as reactors 12 and 14 illustrated in FIG. 1, and during adsorption of the refrigerant, may be cooled by ambient temperature air, and preferably assisted by forced air fan 64. The apparatus includes a conduit 61 for directing the gaseous refrigerant between reactors 60 and 64, and valve 63 for selectively opening and closing the conduit 61. Electronic or computer equipment 62 is illustrated with component 65 to be cooled according to the invention.

Second, cooling or low temperature reactor 64 may also be of a construction like that of reactor 60, although it need not incorporate means for heating the complex compound. Of course, the cold temperature reactor is thermally coupled to the equipment or components to be cooled. During operation of the system according to this embodiment, high temperature reactor 60 is heated to desorb ammonia which is directed to the cooling reactor 64 where it is adsorbed in the salt in an exothermic reaction. This phase of the reaction cycle, which may be referred to as the charging phase, will be normally carried out during a time when the equipment 62, or at least the component 65, is partially inactive or not operating and need not be cooled, for example, at night. After the charging phase is complete, valve 63 is closed, and the system is allowed to return to ambient temperature conditions.

When it is desired to achieve the cooling of the component 65, valve 63 is opened, and because of the equilibrium pressure difference between the two different complex compounds, ammonia is suctioned from the compound in reactor 64 to adsorbing reactor 60. The endothermic desorption reaction in reactor 64 causes cooling of the component 65. Reactor 60, is remote from the electronic or computer equipment 62, and thus heat generated by the adsorption reaction is dissipated to ambient conditions at the remote location.

In using the embodiment of FIG. 3, it is important that there be an equilibrium temperature differential between the complex compounds used in the two different reactors 60 and 64. More specifically, it is preferred that the equilibrium temperature differential be between about 10° C. and about 150° C. The term "equilibrium temperature differential" is intended to mean the difference between any two different complex compound equilibrium temperatures at the same or substantially the same operating pressure, typically between about 0.1 and about 35 bars in the apparatus of the invention. Such an equilibrium temperature differential will provide sufficient practical temperature lift and yet be within practical and safe ranges for heat rejection during exothermic ammonia adsorption. The preferred complex compound used in the cooling reactor are the ammonia complexes of $BaCl_2$, $CaCl_2$ and $SrCl_2$ disclosed in application Ser. No. 07/732,652. The preferred ammonia complex compounds used in the heating reactor 60 are:

(a) $CaCl_2.4-8(NH_3)$, (b) $CaCl_2.2-4(NH_3)$, (c) $SrCl_2.1-8(NH_3)$, (d) $LiCl.0-3(NH_3)$, (e) $SrBr_2.0-8(NH_3)$, (f) $CaBr_2.2-6(NH_3)$, (g) $CoCl_2.2-6(NH_3)$, (h) $NiCl_2.2-6(NH_3)$, (i) $FeCl_2.2-6(NH_3)$, (j) $SnCl_2.0-2.5(NH_3)$ and (k) $NaBF_4.0.5-2.5(NH_3)$. In addition $CaCl_2.1-2(NH_3)$ and $CaCl_2.0-1(NH_3)$ complexes are useful particularly in the temperature ranges suitable for $CoCl_2$, $NiCl_2$ and $FeCl_2$ salts, and they may also be used in mixtures with one or more of the other $CaCl_2$ complexes. In the cooling reactor 64 the preferred complex compounds are as follows and paired with the aforesaid complex compounds in reactor 60, as follows:

$BaCl_2.0-8(NH_3)$ with (a)-(k)
$CaCl_2.4-8(NH_3)$ with (c)-(k)
$CaCl_2.2-4(NH_3)$ with (d)-(k)
$SrCl_2.1-8(NH_3)$ with (d)-(k)
$NaBF_4.0.5-2.5(NH_3)$ with (a)-(j).

Although in the aforesaid complex compounds, numerical values of moles of ammonia per mole of salt are given, in some complexes, the mole range comprises several coordination steps. Thus, for example, particularly in the case of $NaBF_4$ and $LiCl$, a number of different neighboring reaction steps occur between the numerical limits given and thus, the coordination spheres are not as well defined as, for example, those of $CaBr_2$ or $SrBr_2$. Typically, however, practical considerations only allow for use of a portion of the design coordination range, and thus the ranges are intended to be approximate, as will be understood by those skilled in the art.

Figure 4:
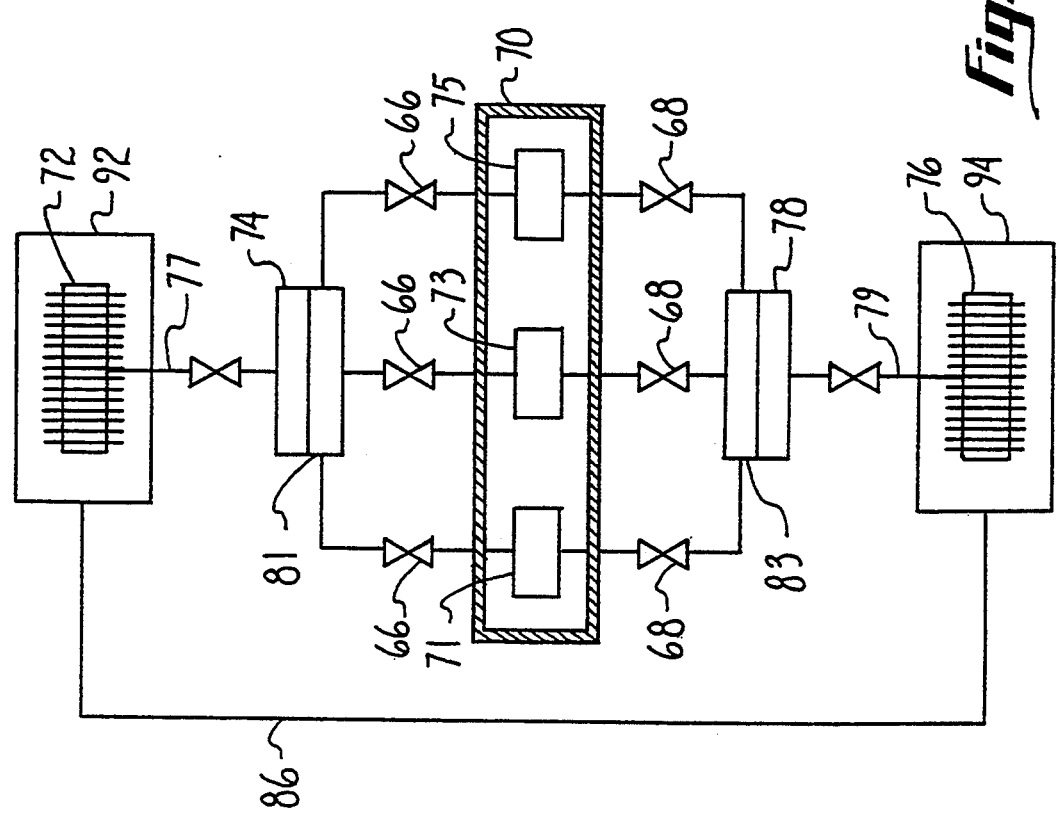
FIG. 4 illustrates two pairs of separate reactors and an indirect cooling apparatus embodiment.

To yield continuous cooling, pairs of two reactor systems of FIG. 3 will be used, each pair operated in opposing or reversed cycles. The cooling reactor of each of such pairs of reactors will cool the same electronic component, and with each pair operating in opposite phases, one of the cooling reactors will always be providing cooling at the component site. However, because the cooling reactor of one pair would be heating at the same time thus causing additional heat load to be offset by the then cooling reactor, it is advantageous to incorporate such an embodiment in an indirect cooling system as illustrated in FIG. 4. In such a system, cooling reactors 74 and 78 cooperate with heat exchangers 81 and 83, respectively, to provide cooling to electronic components 71, 73 and 75 of apparatus or equipment 70. To provide continuous cooling for the electronic components, reactor pair 72, 74 is operated to cool with reactor 72 adsorbing (exothermic) and reactor 74 desorbing (endothermic), while, at the same time, reactor 76 is desorbing and reactor 78 is adsorbing. When reactor 78 is desorbing, the cooling effect is provided by directing a heat exchange fluid through heat exchanger 83 in heat exchange communication with the endothermic reaction occurring in reactor 78, and with valves 68 open to direct the cooling fluid to the electronic components. In this cycle, valves 66 are closed as reactor 74 is adsorbing the refrigerant. The heat of the adsorption for a reactor is dissipated by convenient means, for example to a secondary heat exchanger, not shown, or by heat transfer directly to the ambient environment, without effecting the cooling of the electronic components. When the desorbing reactor is depleted of gaseous refrigerant and the adsorbing reactor saturated, the cycles of the respective reactor pairs are reversed. A number of different operating and valving configurations using direct or indirect heat dissipation within the skill of the art may be incorporated. The indirect cooling system illustrated in FIG. 4 may also be used in the previously described systems. Thus, in the system of FIGS. 1 or 2, the refrigerant may be directed to one or more evaporators thermally cooperating with one or more heat exchangers for providing cooling fluid to the electronic components via a heat transfer loop. Similarly, the cooling reactor 64 (FIG. 2) may be thermally coupled with a heat exchanger which provides cooling fluid directed to one or more electronic components or subassemblies. Fans may optionally be used with such cooling heat exchangers.

It will be understood, as previously noted, that the two reactor embodiment of FIG. 3, which does not use a heat transfer loop, will be generally of interest only where thermal loads, i.e., cooling requirements, are intermittent. Of course, such an embodiment will also be useful only where the heat generated in the cooling reactor during the charging phase can be tolerated by the equipment and components to be cooled. Otherwise, it may be necessary to meter the ammonia to the cooling reactor during the charging phase slowly so that the heat build-up during the exothermic adsorption reaction occurs at a relatively slow rate to prevent overheating of the component or equipment.

Where continuous cooling is desired, in order to produce relatively smooth and constant cooling, and to minimize interruption for cycle reversal, a number of alternatives may be used. For example, a refrigerant reservoir may be used to provide a supply of sufficient condensed refrigerant to provide continued cooling during periods of reactor cycle switching. A similar result will be achieved if the piping is sized, or oversized, such that an excess or reservoir of liquid refrigerant is available in the ammonia lines to supply the evaporator for uninterrupted cooling during cycle switching.

A desired alternative is to provide an auxiliary reactor for adsorbing refrigerant to be supplied from the evaporators during the time the other set or pair of reactors is undergoing switching between cycles. Thus, for example, in the apparatus shown in FIG. 1, a third reactor would be added and its operation time shifted between the other two reactors to provide continuous availability of refrigerant suction for cooling. Similarly, multiple sub-sets or pairs of reactors used in time shifted cycle operation to achieve such continuous cooling may be used within the scope of the invention.

Where air cooled reactors are used, illustrated for example in FIGS. 1 and 3, the reactor design may include various design configurations for reducing heat loss during the reactor heating desorption phase and maximize heat dissipation during exothermic absorption reactions. Various surfaces and surface extensions such as plates, fins, corrugated or spiral surfaces, etc. may be used. Different reactor designs may also be incorporated, for example, an annular or a hollow tubular reactor 60 shown in FIG. 3, whereby heat rejection may be carried out by direct air cooling of the center of the reactor and/or the outer surface. The inside of such a tubular reactor may be a preferred surface for heat exchange because natural convection that occurs during reactor heating is minimized while forced convection can be initiated and controlled using fans during a desired heat rejection phase.

FIGS. 4 and 5 also illustrate yet another embodiment of the invention as an alternative to air cooled reactors, in using phase change heat exchange fluid advantageously to both conserve and reject heat between multiple reactors during alternating complex compound adsorption and desorption cycles. In the schematic apparatus shown in FIG. 4, reactor housing jackets 92 and 94 enclose complex compound reactors 72 and 76, respectively, and in FIG. 5, jackets 82 and 84 enclose reactors 12 and 14, respectively. A phase change heat transfer fluid is contained in the jackets and a conduit 86 is provided for directing the heat transfer fluid between the jackets.

During operation, where the complex compound or salt in a reactor adsorbs ammonia, or other gaseous refrigerant, the exothermic reaction gives off heat energy, desirably dissipated by the reactor housing into the heat transfer fluid contained in a jacket and contacting the reactor exterior. In a condensed liquid state the heat transfer fluid is a good heat conductor, compared to its vapor state. In a FIG. 1 system incorporating heat transfer fluid jackets as shown in FIG. 5, with the reactors 12 and 14 alternately adsorbing and desorbing gaseous refrigerant, during exothermic adsorption, normally carried out at a lower temperature than the desorption reaction, the heat transfer fluid in the jacket surrounding the adsorbing reactor is in the liquid state and thus efficiently conducts heat from the reactor to the outside jacket. Such heat transfer may be enhanced by having the jacket only partially filled with heat transfer liquid covering most, or all, of the reactor surface, but leaving a free space in the jacket such that the heat of adsorption results in vaporization of the liquid by boiling, which is then condensed on the jacket surface at one or more sites or locations which are cold, or which are cooled from the exterior, for example, by convective or forced (fan) air flow. Heat transfer fluid vaporized by absorbing heat from high temperature desorption passes through conduit 86 and is condensed in the jacket surrounding the adsorbing reactor. Similarly, in a FIG. 4 system, the exothermic adsorption reaction occurs typically at a lower temperature than the electrically driven desorption reaction and the heat transfer fluid in thermal contact with the adsorbing reactor becomes and remains liquid as it continues to conduct the reaction heat from the reactor to the jacket. In the desorbing high temperature reactor jacket the heat transfer fluid vaporizes and expands to the lower temperature reactor jacket. The vapor remaining in the high temperature jacket is a poor thermal conductor and thus acts to insulate and conserve energy. Thus, in FIG. 4, as reactor 76 desorbs in a high temperature desorption as compared to a lower temperature adsorption in reactor 72, heat transfer fluid in jacket 94 expands into jacket 92 via conduit 86 and is condensed to the liquid phase in jacket 92. When the adsorption/desorption cycles are reversed, the heat transfer fluid phase change cycles will also be reversed. Such an embodiment takes advantage of the different thermal conductivity of fluid in liquid or gaseous state, respectively, thus conserving energy during high temperature desorption by providing poor thermal conductivity and insulation in the gaseous state, and facilitating heat rejection during the exothermic adsorption by providing good thermal conductivity in the liquid state. Other apparatus and hardware configuration and components may be used and incorporated to take advantage of such and embodiment. Thus, for example, multiple conduits between the jackets may be used as may different jacket designs or configurations, different reactor fin or heat transfer designs such as annular or hollow core reactors, etc., fluid pumps, valves, including check valves, as well as heat exchangers cooperating with the jackets and/or heat transfer loop conduits for cooling the heat transfer fluid or the reactor directly. Conventional and useful heat transfer fluids include water, ethylene glycol compositions, heat transfer oils or even a refrigerant, such as ammonia or FREON. Various commercial compositions known in the art such as "DOWNTHERM" (registered trademark of Dow Chemical Co.) phase change heat transfer media may also be used.

The cooling apparatus and system of the present invention offer advantages over previously used systems or methods of maintaining cool or ambient equipment components operating temperatures which often required cooling of the entire equipment or the space in which it was being operated, as previously noted. The present invention provides for small, high power density cooling devices which localize heat removal in the temperature range of about $-80°$ F. to about $100°$ F. Such a cooling system is especially useful for sealed compartment circuits or components without requiring air flow cooling thereby eliminating dust problems encountered with convective or typical thermoelectric air cooling systems. Utilizing the complex compound adsorption and desorption techniques as described herein, the disadvantages of CFC refrigerants are obviated. Because the high powered density cooling of the invention, the entire cooling system apparatus may be relatively compact, and even portable, unlike previously used systems. The cooling elements for the electronic components may comprise capillary tubes having means for being easily connected and disconnected with heat exchange fluid and refrigerant conduits or manifolds. Alternatively, the cooling elements may be thermally conductive devices such as filaments, wires, ribbons, etc., integrated into the circuit board or other electronic component construction and thermally connected to the refrigerant or cooling heat exchange fluid components of the system of the invention for removing and transferring heat from the electronic component. Because of the compactness of the system, with heat discharged at ambient or room temperatures, and refrigerant condensed at room temperature, complex and expensive equipment may be avoided. Moreover, few moving parts are required, other than the optional use of fans to provide forced air for assisting in cooling of the reactors.

The proper selection of the complex compound allows for automatic or self-control of the cooling temperature at the evaporators. In addition, the specific temperature at the evaporator site can be monitored utilizing known temperature sensing or monitoring devices. The system may also include thermostatic controls used in combination with the temperature sensors and with the heaters for the reactors and the control valve or valves in the conduit system between the reactors and the evaporators for achieving and holding desired desorption reaction rates and metering of the refrigerant to the evaporators to maintain desired component temperatures. These as well as other advantages and uses of the systems disclosed herein as well as the modification of the equipment within the scope of the invention herein will be evident to those skilled in the art.

What is claimed is:

1. Apparatus for cooling one or more equipment components or subassemblies, said apparatus comprising one or more first reactors located at a remote location from said equipment, and one or more second reactors located in heat exchange communication with a component or subassembly of said equipment, each of said first reactors containing the same first complex compound therein and each of said second reactors containing the same second complex compound therein, different from said first complex compound, said complex compounds comprising a chemisorption reaction product of a polar refrigerant and a metal halide, nitrate, nitrite, sulfide, oxalate, sulphate or chlorate salt or double metal chloride salt, or mixtures, or eutectic, peritectic or stoichiometric mixtures of said salts, of a metal selected from the group consisting of alkali and alkaline earth metal, transition metal, aluminum, zinc, copper, cadmium and tin, wherein the equilibrium temperature of the first complex compound in said one or more first reactors differs from the equilibrium temperature of the second complex compound in said one or more second reactors by between about $10°$ C. and about $150°$ C. at the same operating pressure, heating means for heating a complex compound in said one or more first reactors, and conduit means for directing polar refrigerant between said first and second reactors.

2. Apparatus of claim 1 wherein said first complex compound is selected from the group consisting of:
$CaCl_2.4-8(NH_3)$,
$CaCl_2.2-4(NH_3)$,
$SrCl_2.1-8(NH_3)$,
$LiCl.0-3(NH_3)$,
$SrBr_2.0-8(NH_3)$,
$CaBr_2.2-6(NH_3)$,
$CoCl_2.2-6(NH_3)$,
$NiCl_2.2-6(NH_3)$,
$FeCl_2.2-6(NH_3)$,
$SnCl_2.0-2.5(NH_3)$, and
$NaBF_4.0.5-2.5(NH_3)$.

3. Apparatus of claim 2 wherein said second complex compound is selected from the group consisting of $BaCl_2.0-8(NH_3)$, $CaCl_2.4-8(NH_3)$, $CaCl_2.2-4(NH_3)$, $SrCl_2.1-8(NH_3)$ and $NaBF_4.0.5-2.5(NH_3)$.

4. Apparatus of claim 2 wherein said second complex compound is $BaCl_2.0-8(NH_3)$.

5. Apparatus of claim 1 wherein said second complex compound is selected from the group consisting of $SrCl_2.1-8(NH_3)$, $LiCl.0-3(NH_3)$, $SrBr_2.0-8(NH_3)$, $CaBr_2.2-6(NH_3)$, $CoCl_2.2-6(NH_3)$, $NiCl_2.(NH_3)$, $FeCl_2.2-6(NH_3)$, $SnCl_2.0-2.5(NH_3)$ and $NaBF_4.0.5-2.5(NH_3)$, and said second complex compound is $CaCl_2.4-8(NH_3)$.

6. Apparatus of claim 1 wherein said first complex compound is selected from the group consisting of $LiCl.0-3(NH_3)$, $SrBr_2.0-8(NH_3)$, $CaBr_2.2-6(NH_3)$, $CoCl_2.2-6(NH_3)$, $NiCl_2.2-6(NH_3)$, $FeCl_2.2-6(NH_3)$, $SnCl_2.0-2.5(NH_3)$, and $NaBF_4.0.5-2.5(NH_3)$, and said second complex compound is $CaCl_2.2-4(NH_3)$.

7. Apparatus of claim 1 wherein said first complex compound is selected from the group consisting of $LiCl.0-3(NH_3)$, $SrBr_2.0.8(NH_3)$, $CaBr_2.2-6(NH_3)$, $CoCl_2.(NH_3)$, $NiCl_2.2-6(NH_3)$, $FeCl_2.2-6(NH_3)$, $SnCl_2.0-2.5(NH_3)$ and $NaBF_4.0.5-2.5(NH_3)$, and said second complex compound is $SrCl_2.1-8(NH_3)$.

8. Apparatus of claim 1 wherein said first complex compound is selected from the group consisting of $CaCl_2.4-8(NH_3)$, $SrCl_2.1-8(NH_3)$, $LiCl.0-3(NH_3)$, $SrBr_2.0-8(NH_3)$, $CaBr_2.2-6(NH_3)$, $CoCl_2.2-6(NH_3)$, $NiCl_2.2-6(NH_3)$, $FeCl_2.2-6(NH_3)$ and $SnCl_2.0-2.5(NH_3)$, and wherein said second complex compound is $NaBF_4.0.5-2.5(NH_3)$.

9. Apparatus of claim 1 including first and second heat exchangers, in heat exchange communication with said one or more second reactors and said one or more components or subassemblies, respectively, and second conduit means for directing heat exchange fluid between said first and second heat exchangers, respectively.

10. Apparatus of claim 9 including fan means cooperating with said second heat exchanger for cooling said components or subassemblies.

11. A system for cooling one or more equipment components or subassemblies, comprising, in combination, two or more pairs of first and second reactors of an apparatus of claim 1, and control means for operating each of said pairs in substantially opposite adsorption/desorption cycle phases.

12. Apparatus of claim 11 including a jacket for housing each of said first reactors and containing a phase change heat exchange fluid, and a conduit communicating with said jackets for directing said heat exchange fluid therebetween.

13. Apparatus of claim 12 including heat exchange means cooperating with said jackets for cooling said heat exchange fluid.

14. Apparatus of claim 11 including heat exchange means cooperating with said second reactors and said one or more components or subassemblies, and one or more conduits cooperating with said heat exchange means for directing a heat transfer fluid between a second reactor and said one or more components or subassemblies.

15. Apparatus of claim 14 including one or more valves cooperating with said one or more conduits for directing heat transfer fluid between said one or more components or subassemblies and a second reactor during desorption therein, and for terminating heat transfer fluid flow between said one or more components or subassemblies and a second reactor during adsorption therein.

16. Apparatus of claim 15 including a jacket for housing each of said first reactors and containing a phase change heat exchange fluid, and a conduit communicating with said jackets for directing said heat exchange fluid therebetween.

* * * * *